(12) United States Patent
Hu

(10) Patent No.: US 10,154,599 B2
(45) Date of Patent: Dec. 11, 2018

(54) REDISTRIBUTION FILM FOR IC PACKAGE

(71) Applicant: Dyi-Chung Hu, Hsinchu County (TW)

(72) Inventor: Dyi-Chung Hu, Hsinchu County (TW)

(*) Notice: Subject to any disclaimer, the term of this patent is extended or adjusted under 35 U.S.C. 154(b) by 0 days.

(21) Appl. No.: 15/606,680

(22) Filed: May 26, 2017

(65) Prior Publication Data

US 2017/0265312 A1   Sep. 14, 2017

Related U.S. Application Data

(63) Continuation of application No. 14/542,191, filed on Nov. 14, 2014, now Pat. No. 9,756,738.

(51) Int. Cl.
*H01L 23/00* (2006.01)
*H05K 3/46* (2006.01)
*H01L 21/683* (2006.01)

(52) U.S. Cl.
CPC ....... *H05K 3/4682* (2013.01); *H01L 21/6835* (2013.01); *H01L 24/16* (2013.01); *H01L 24/32* (2013.01); *H01L 24/81* (2013.01); *H01L 2221/68318* (2013.01); *H01L 2221/68359* (2013.01); *H01L 2224/16227* (2013.01); *H01L 2224/16235* (2013.01); *H01L 2224/32225* (2013.01); *H01L 2224/73204* (2013.01); *H01L 2924/14* (2013.01); *H01L 2924/15311* (2013.01); *H05K 2201/10674* (2013.01)

(58) Field of Classification Search
CPC ............ H01L 2224/48227; H01L 2224/48225
See application file for complete search history.

(56) References Cited

U.S. PATENT DOCUMENTS

| | | | |
|---|---|---|---|
| 8,817,486 B2 | 8/2014 | Kim et al. | |
| 8,823,187 B2 | 9/2014 | Shimizu et al. | |
| 2005/0218502 A1* | 10/2005 | Sunohara | H01L 23/49822 257/700 |
| 2013/0105213 A1* | 5/2013 | Hu | H05K 1/112 174/266 |
| 2013/0249075 A1 | 9/2013 | Tateiwa et al. | |
| 2014/0102777 A1 | 4/2014 | Chen et al. | |

* cited by examiner

*Primary Examiner* — Fernando L Toledo
*Assistant Examiner* — Lawrence-Linh T Nguyen
(74) *Attorney, Agent, or Firm* — JCIPRNET

(57) ABSTRACT

A redistribution film for IC package is disclosed, which comprises a top redistribution layer configured on top of a bottom redistribution layer. The top redistribution layer is fabricated following PCB design rule, and the bottom redistribution layer is fabricated following IC design rule. Further, the interface between the top redistribution layer and the bottom redistribution layer is optionally made roughed to increase bonding forces therebetween.

9 Claims, 18 Drawing Sheets

REDISTRIBUTION FILM FOR IC PACKAGE

This application is a continuation of U.S. application Ser. No. 14/542,191 filed Nov. 14, 2014 the disclosure of which is incorporated by reference herein in its entirety.

BACKGROUND

Technical Field

The present invention relates to a redistribution film for IC package, especially relates to a film composed of double redistribution layers where a top redistribution layer is made and configured on top of a bottom redistribution layer. The top redistribution layer is fabricated following PCB design rule and the bottom redistribution layer is fabricated following IC design rule.

Description of Related Art

FIG. 1A shows a prior art substrate for IC package.

FIG. 1A shows a prior art substrate for IC package disclosed in US2014/0102777A1 which has an embedded silicon interposer 20. The silicon interposer 20 has four lateral sides 206. A molding compound 22 wraps the silicon interposer 20 around the four lateral sides 206. A plurality of via metal 200 is made through the silicon interposer 20. An insulation liner 201 is made between the through via 200 and the silicon interposer 20 for an electrical insulation therebetween. A top redistribution layer 21 is made on top of the silicon interposer 20 with a plurality of metal pad 210 exposed on top. The plurality of metal pad 210 on top is provided for accommodating an IC chip (not shown) to mount. A circuit built-up layer 25 is made on bottom of the silicon interposer 20 with a plurality of metal pad 220 configured on bottom. A plurality of solder ball 24 is configured and each solder ball 24 is configured on bottom of a corresponding bottom metal pad 220.

FIG. 1B shows a reversed view of FIG. 1A. FIG. 1B is made to present the prior art of FIG. 1A in a position similar to a package substrate of the present invention to facilitate a comparison there between. FIG. 1B shows an up-down view of FIG. 1A. The top solder ball 24 is configured for mounting the package substrate onto a mother board (not shown). The bottom metal pad 210 is configured for a chip or chips to mount.

BRIEF DESCRIPTION OF THE DRAWINGS

FIGS. 2A~2I show a fabricating process for a first embodiment according to the present invention.

DETAILED DESCRIPTION OF THE INVENTION

FIGS. 2A~2I show a fabricating process for a first embodiment according to the present invention.

Figure 1A:
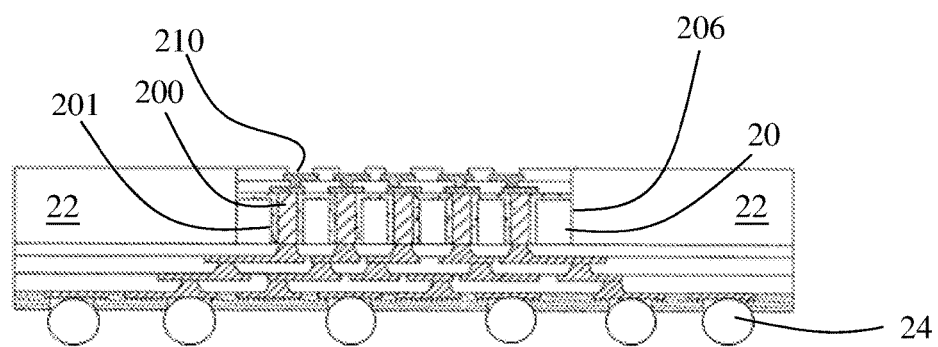
FIGS. 1A~1B show a prior art substrate for IC package.
Figure 1B:
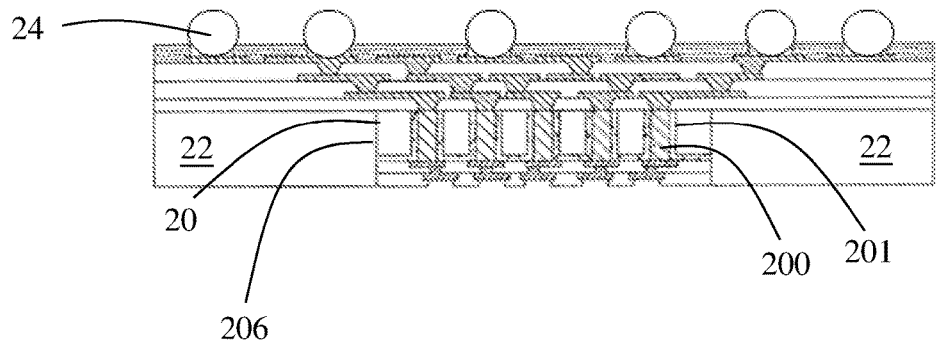
Figure 2A:
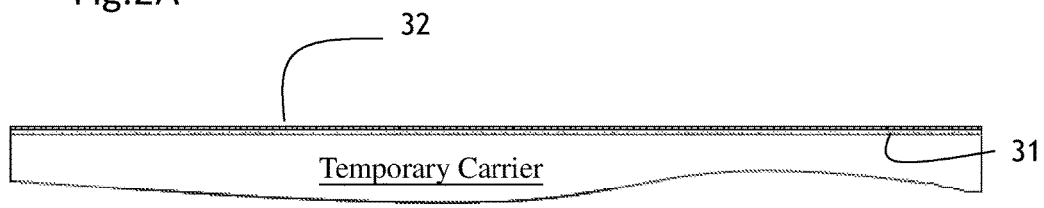

FIG. 2A shows: preparing a temporary carrier; applying a release layer 31 on top of the temporary carrier; and applying a seed layer 32 on top of the release layer 31.

Figure 2B:
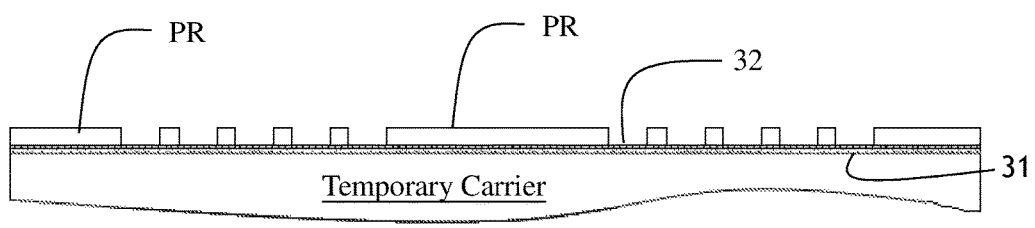

FIG. 2B shows: applying a patterned photoresist PR on top of the seed layer 32.

Figure 2C:
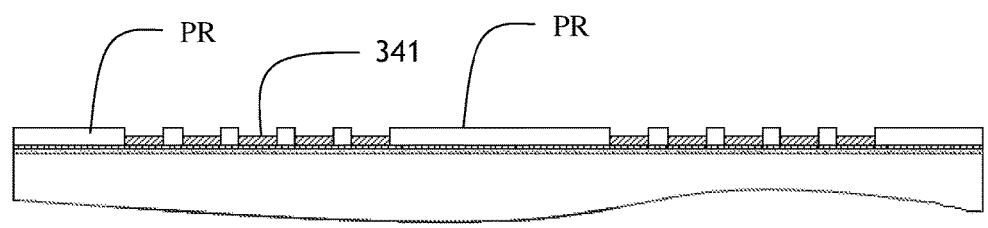

FIG. 2C shows: forming a patterned bottom metal pad 341.

Figure 2D:
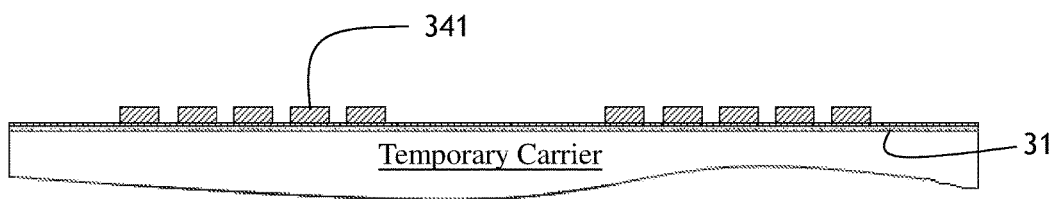

FIG. 2D shows: stripping the photoresist 33; and leaving a plurality of bottom metal pad 341.

Figure 2E:
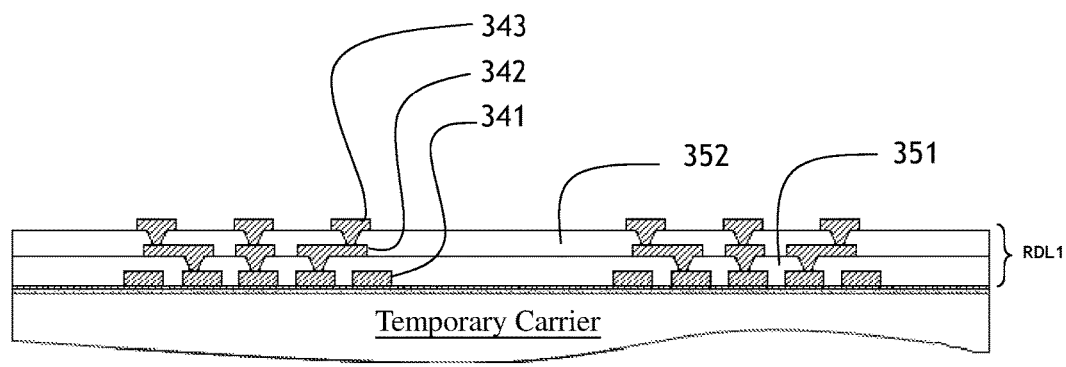

FIG. 2E shows: forming a bottom redistribution layer RDL1, at least one redistribution circuit 342 is included in the RDL1, the redistribution circuit 342 is made using the bottom metal pad 341 as a start point according to IC design rule or equivalent; forming a plurality of first top metal pad 343 on top of the bottom redistribution layer RDL1. A plurality of dielectric layer 351, 352 is intervened among the circuit 341, 342, 343 according to conventional IC fabricating processes. The circuit 341, 342, 343 are collectively called redistribution circuit.

Figure 2F:
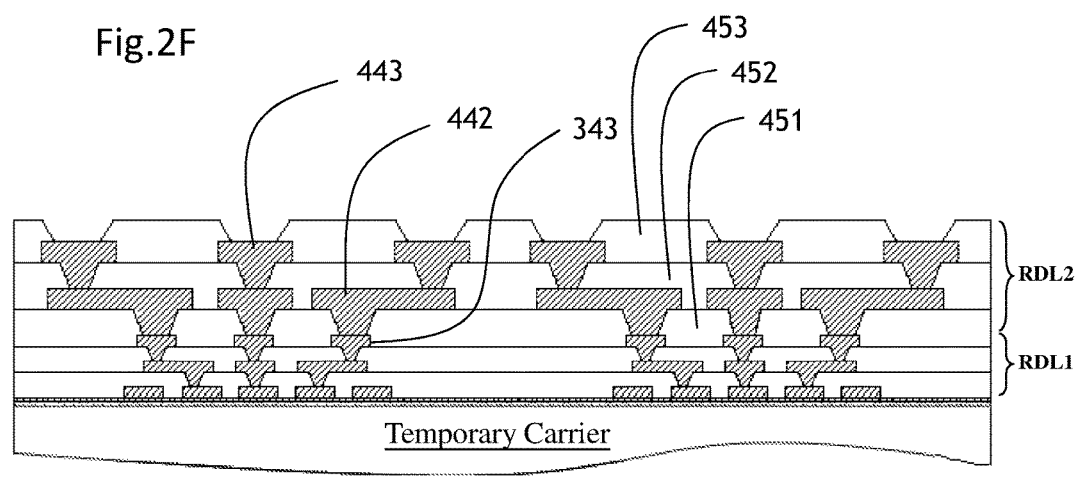

FIG. 2F shows: forming a top redistribution layer RDL2 according to conventional PCB fabricating processes or equivalent on top of the bottom redistribution layer RDL1; forming a plurality of second top metal pad 443 on top of the top redistribution layer RDL2; at least one redistribution circuit 442 is included and is made using the first top metal pad 343 as a start point. The redistribution 442 is electrically coupled to the second top metal pad 443. The circuit 443, 442 are collectively called redistribution circuit. Dielectric layers 451, 452, 453 are intervened among the redistribution circuit 443, 442. The dielectric material for PCB fabricating process can be one of polyimide (PI), prepreg (PP) or benzocyclobutene (BCB).

Figure 2G:
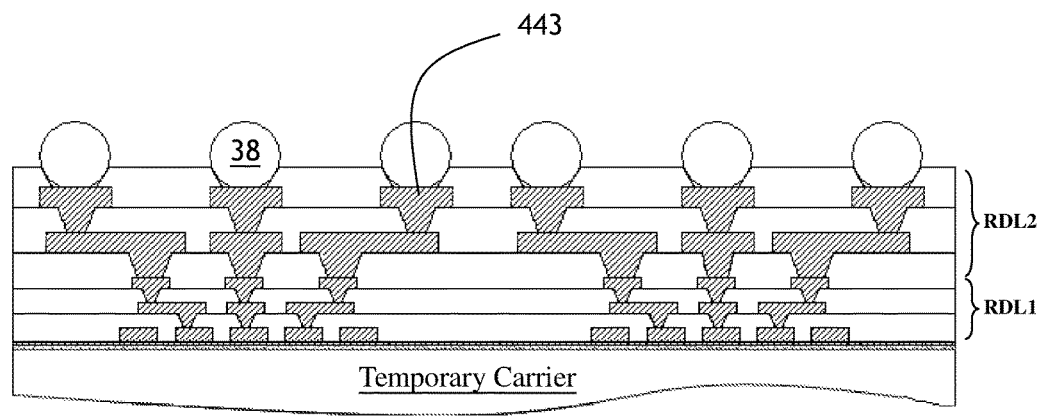

FIG. 2G shows: planting a plurality of solder ball 38, each is planted on top of a corresponding second top metal pad 443.

Figure 2H:
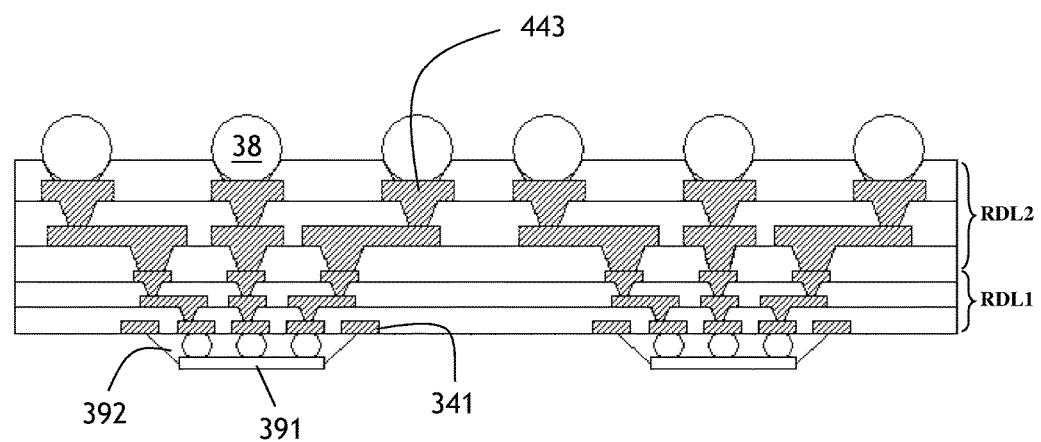
Figure 21:
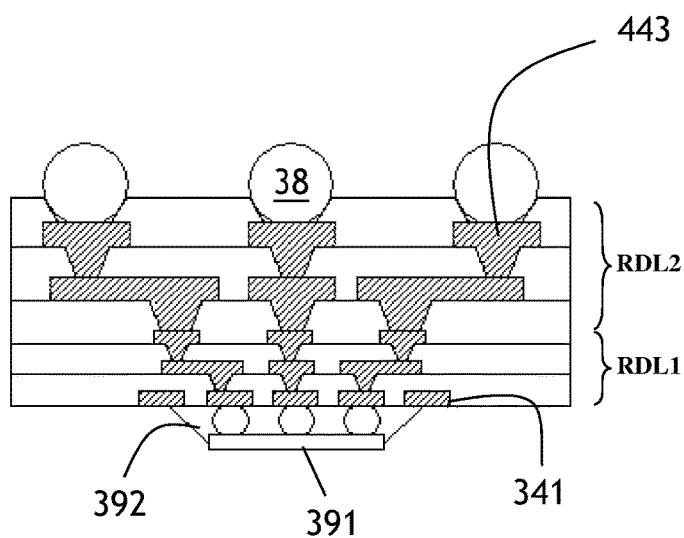

FIG. 2H shows: removing the temporary carrier; and removing the seed layer 32 from bottom of the bottom redistribution layer RDL1; and mounting at least a chip 391 on bottom of the bottom metal pad 341. Underfill 392 is configured in a space between the chip 391 and the metal pad 341.

FIG. 2I shows: a single unit IC package singulated from the product of FIG. 2H.

FIG. 3A~3I fabricating process for a second embodiment according to the present invention.

FIGS. 3A~3D are the same as FIGS. 2A~2D, for simplification, the description to FIGS. 3A~3D is omitted.

Figure 3A:
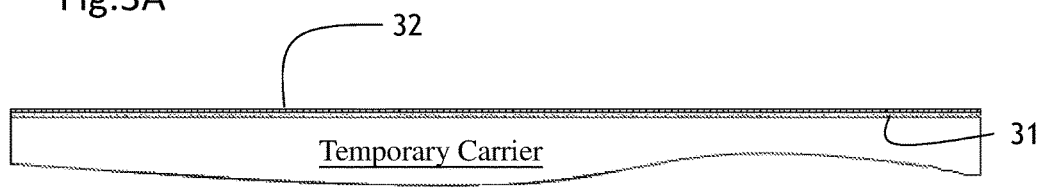
FIGS. 3A~3I show a fabricating process for a second embodiment according to the present invention.
Figure 3B:
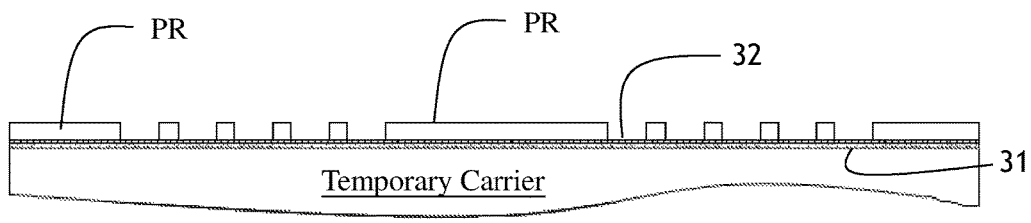
Figure 3C:
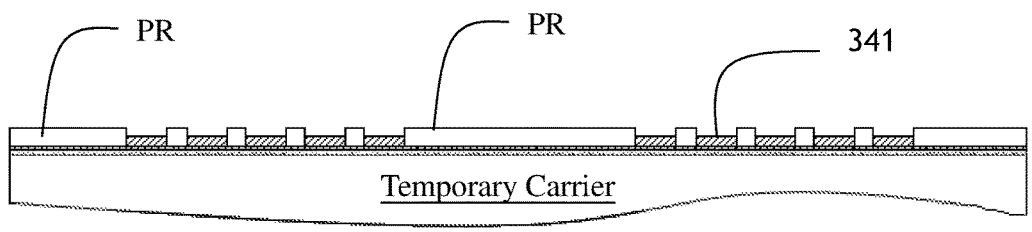
Figure 3D:
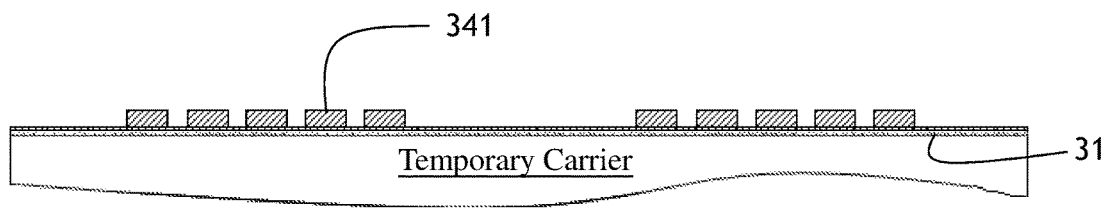
Figure 3E:
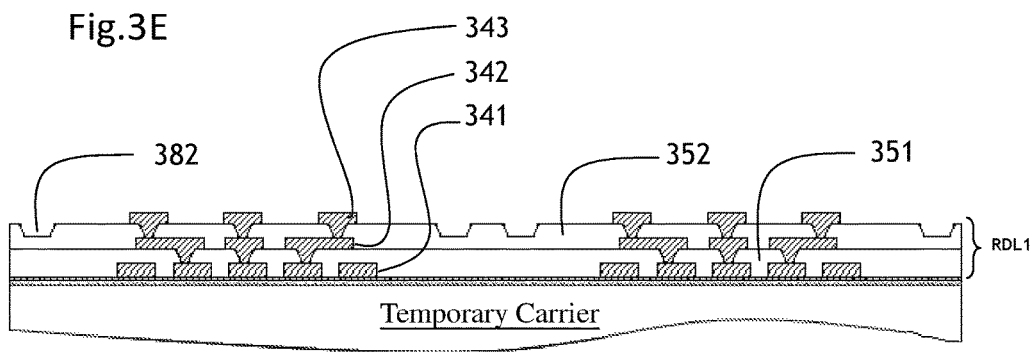

FIG. 3E shows: a plurality of recess 382 is made on top of a top dielectric layer of the bottom redistribution layer RDL1. The recess 382 is made to enhance the roughness of the top surface of the bottom redistribution layer RDL1. The increased roughness enhances bonding force to a layer formed on top of the bottom redistribution layer RDL1 in a later fabricating process.

Figure 3F:
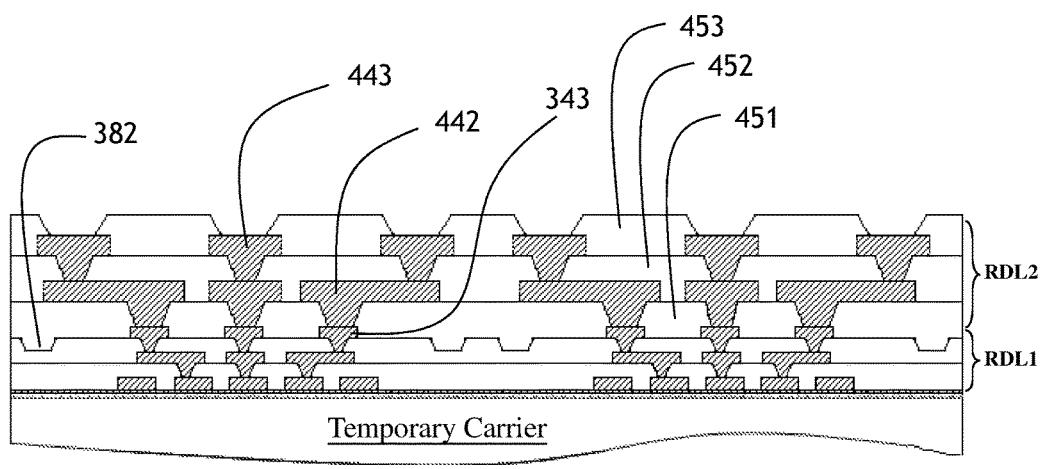

FIGS. 3F~3I are similar to FIGS. 2F~2I, we describe again as follows:

FIG. 3F shows: forming a top redistribution layer RDL2 according to conventional PCB fabricating processes or equivalent on top of the bottom redistribution layer RDL1; forming a plurality of second top metal pad 443 on top of the top redistribution layer RDL2; at least one redistribution circuit 442 is included and is made using the first top metal pad 343 as a start point. The redistribution 442 is electrically coupled to the second top metal pad 443. The circuit 443, 442 are collectively called redistribution circuit. Dielectric layers 451, 452, 453 are intervened among the redistribution circuit 443, 442. The dielectric material for PCB fabricating process can be one of polyimide (PI), prepreg (PP) or benzocyclobutene (BCB).

Figure 3G:
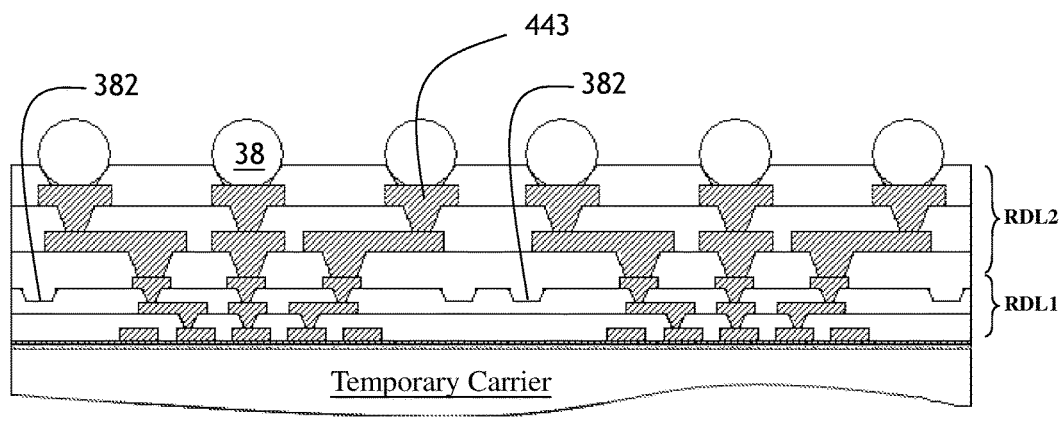

FIG. 3G shows: planting a plurality of solder ball 38, each is planted on top of a corresponding second top metal pad 443.

Figure 3H:
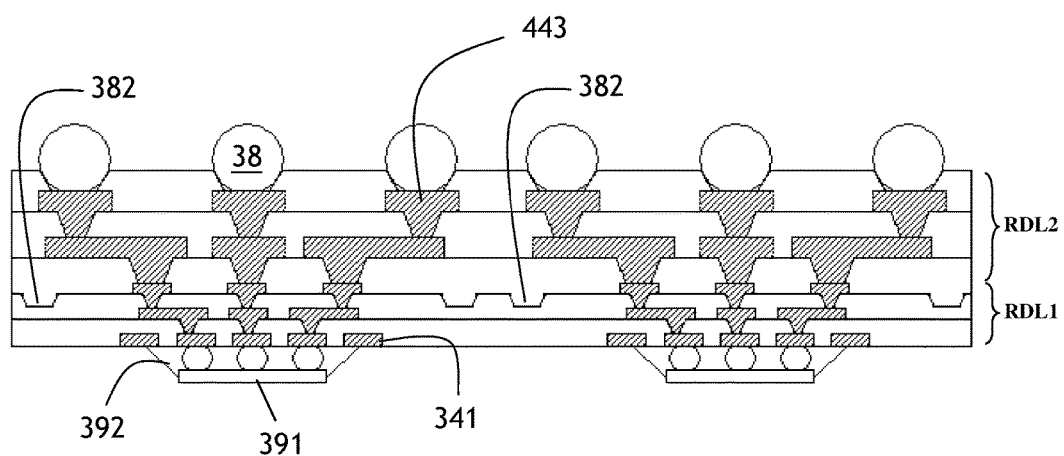

FIG. 3H shows: removing the temporary carrier; and removing the seed layer 32 from bottom of the bottom redistribution layer RDL1; and mounting at least a chip 391 on bottom of the bottom metal pad 341. Underfill 392 is configured in a space between the chip 391 and the metal pad 341.

Figure 3I:
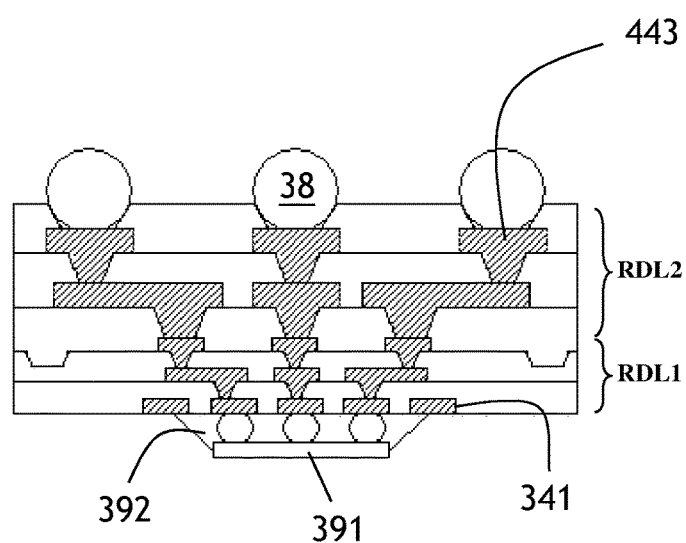

FIG. 3I shows: a single unit IC package singulated from the product of FIG. 3H.

FIG. 3I is a single unit of IC package with a roughed interface between top redistribution layer RDL2 and bottom redistribution layer RDL1. The roughness is caused by the plurality of recess 382.

FIG. 4A~4M fabricating process for a third embodiment according to the present invention.

FIGS. 4A~4E are the same as FIGS. 2A~2E, for simplification, the description to FIGS. 4A~4E is omitted.

FIG. 4F~4J shows: a plurality of recess 382 is made on a top dielectric layer of the bottom redistribution layer RDL1. The plurality of recess 382 is made to enhance the roughness of the top surface of the bottom redistribution layer RDL1. The increased roughness enhances bonding force to a layer formed on top of the bottom redistribution layer RDL1 in a later fabricating process.

Figure 4A:
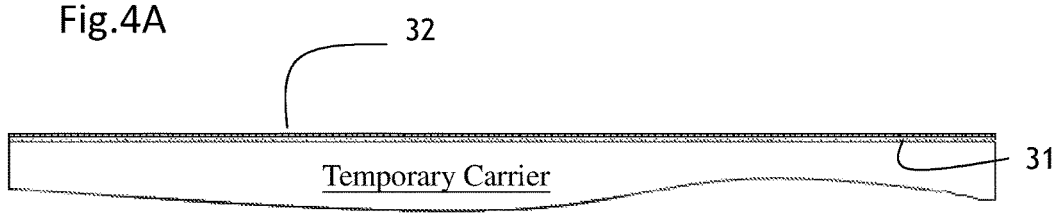
FIGS. 4A~4N show a fabricating process for a third embodiment according to the present invention.
Figure 4B:
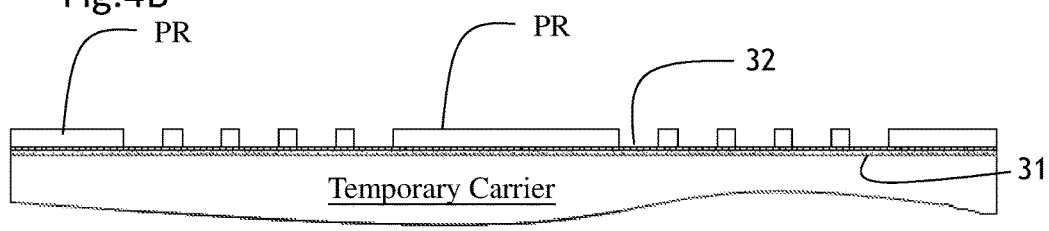
Figure 4C:
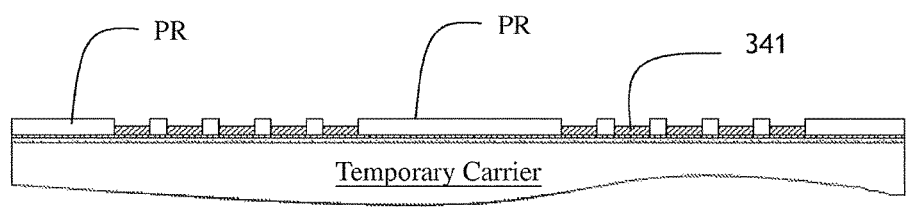
Figure 4D:
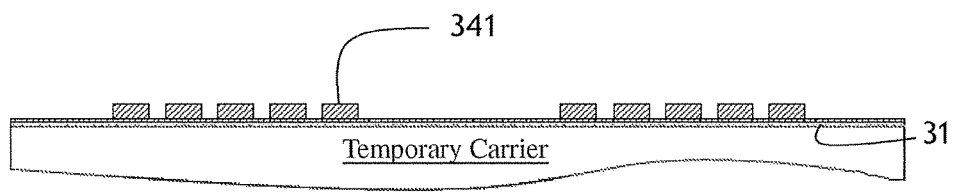
Figure 4E:
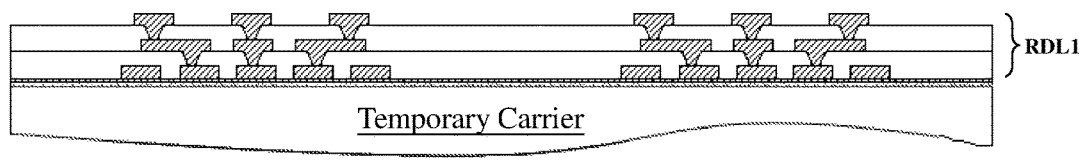
Figure 4F:
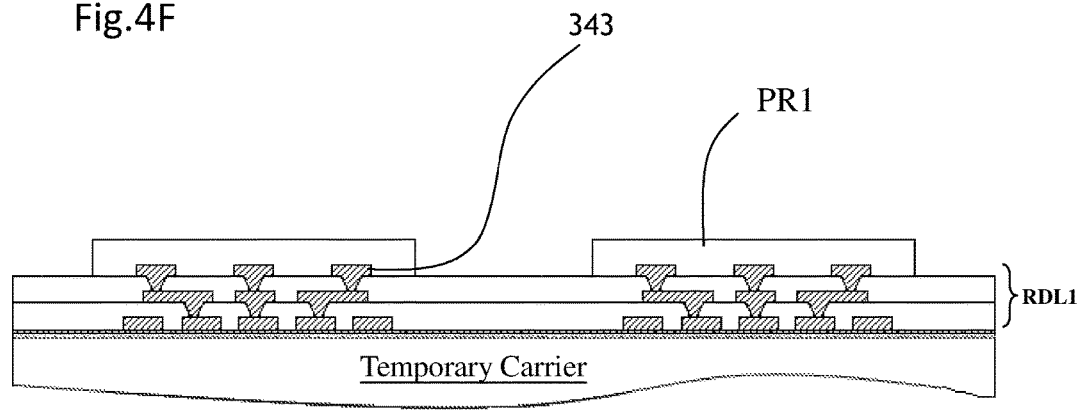

FIG. 4F shows: applying a first patterned photoresist PR1 on top of the bottom redistribution layer RDL1 and exposing partial top surface of the bottom redistribution layer RDL1.

Figure 4G:
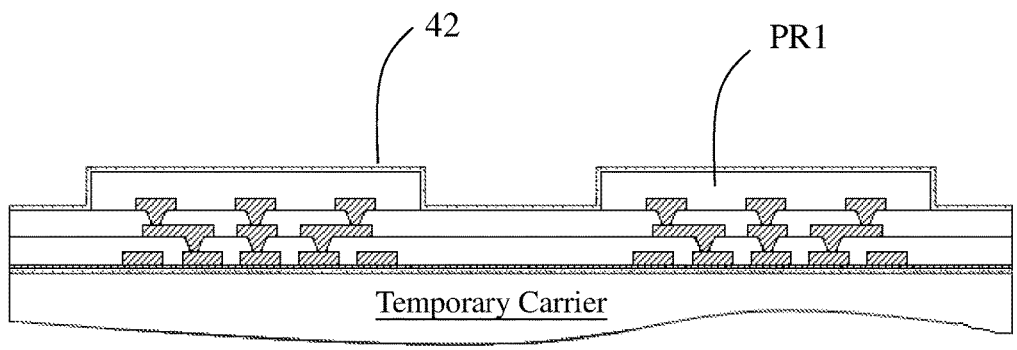

FIG. 4G shows: applying a seed layer 42 on top of the first photoresist PR1 and on the exposed top surface of the bottom redistribution layer RDL1.

Figure 4H:
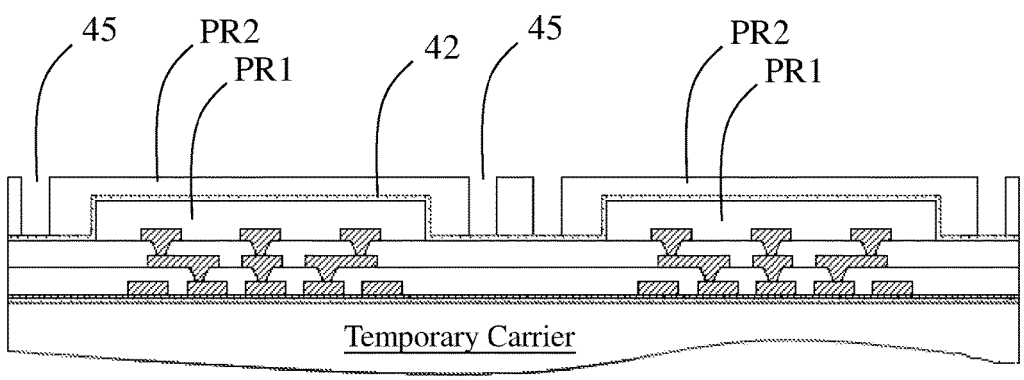

FIG. 4H shows: applying a second patterned photoresist PR2 on top of the seed layer 42; forming a plurality of trench 45 to expose the seed layer 42 on a bottom of each corresponding trench 45.

Figure 4I:
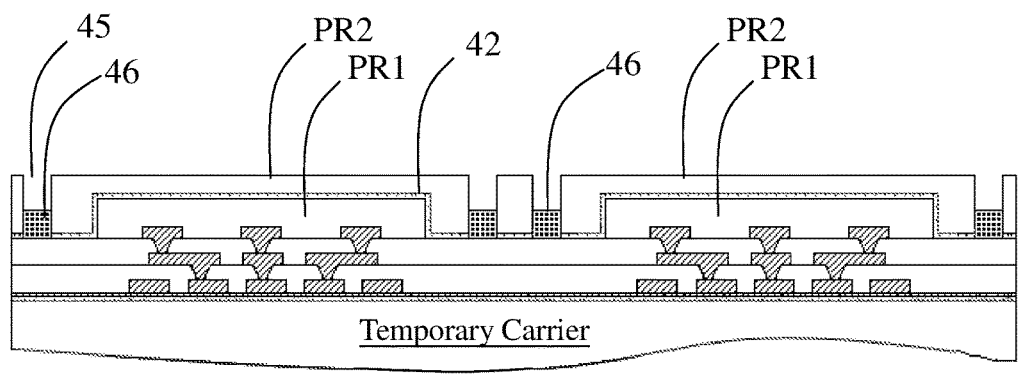

FIG. 4I shows: forming a metal bump 46 in each corresponding trench 45 using the seed layer 42 as a start point.

Figure 4J:
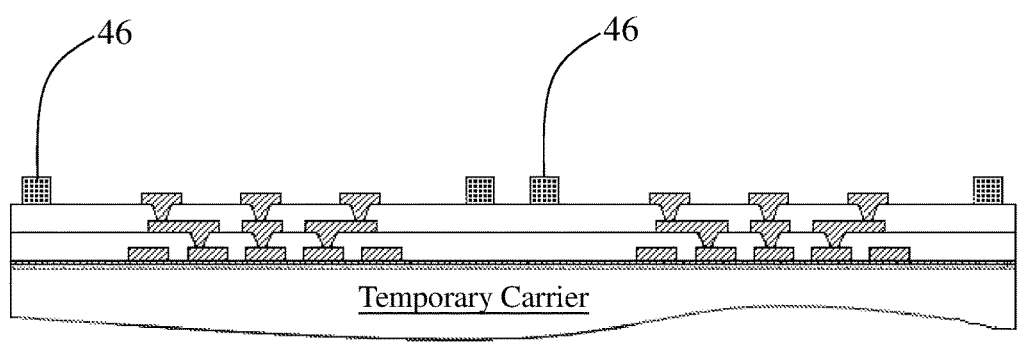

FIG. 4J shows: stripping the second photoresist PR2; stripping the seed layer 42; stripping the first photoresist PR1; and leaving a plurality of metal bump 46 on top of a top dielectric layer of the bottom redistribution layer RDL1.

Figure 4K:
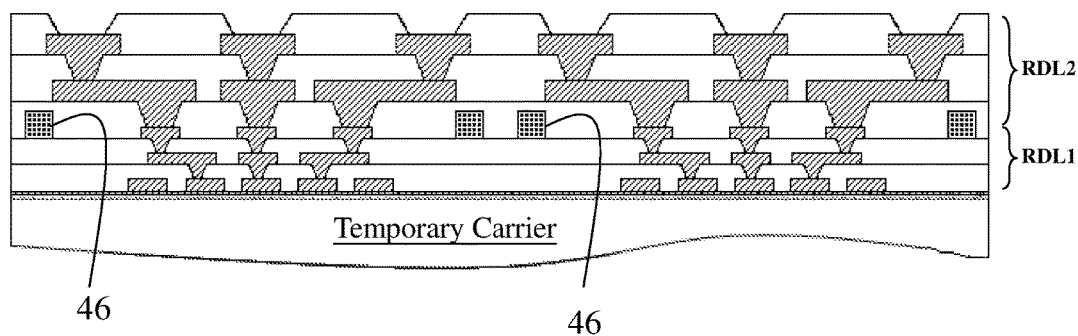

FIGS. 4K~4N are the same as FIGS. 2F~2I, we describe again as follows:

FIG. 4K shows: forming a top redistribution layer RDL2 according to conventional PCB fabricating processes or equivalent on top of the bottom redistribution layer RDL1; forming a plurality of second top metal pad 443 on top of the top redistribution layer RDL2; at least one redistribution circuit 442 is included and is made using the first top metal pad 343 as a start point. The redistribution 442 is electrically coupled to the second top metal pad 443. The circuit 443, 442 are collectively called redistribution circuit. Dielectric layers 451, 452, 453 are intervened among the redistribution circuit 443, 442. The dielectric material for PCB fabricating process can be one of polyimide (PI), prepreg (PP) or benzocyclobutene (BCB).

Figure 4L:
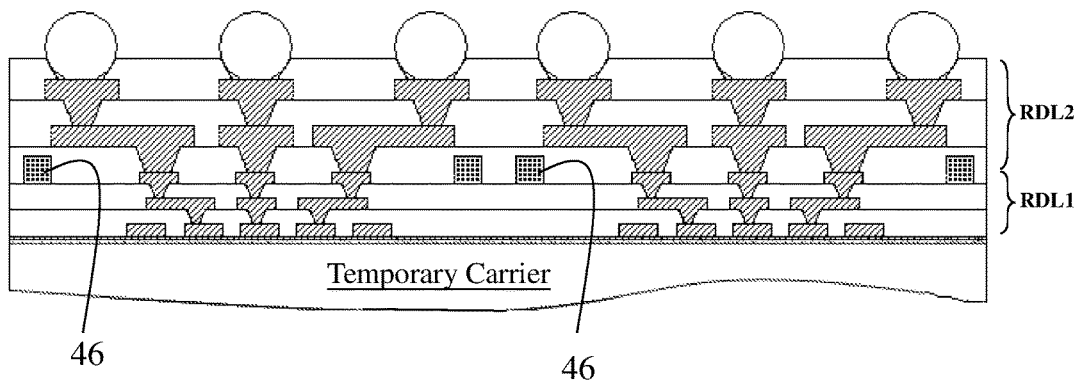

FIG. 4L shows: planting a plurality of solder ball 38, each is planted on top of a corresponding second top metal pad 443.

Figure 4M:
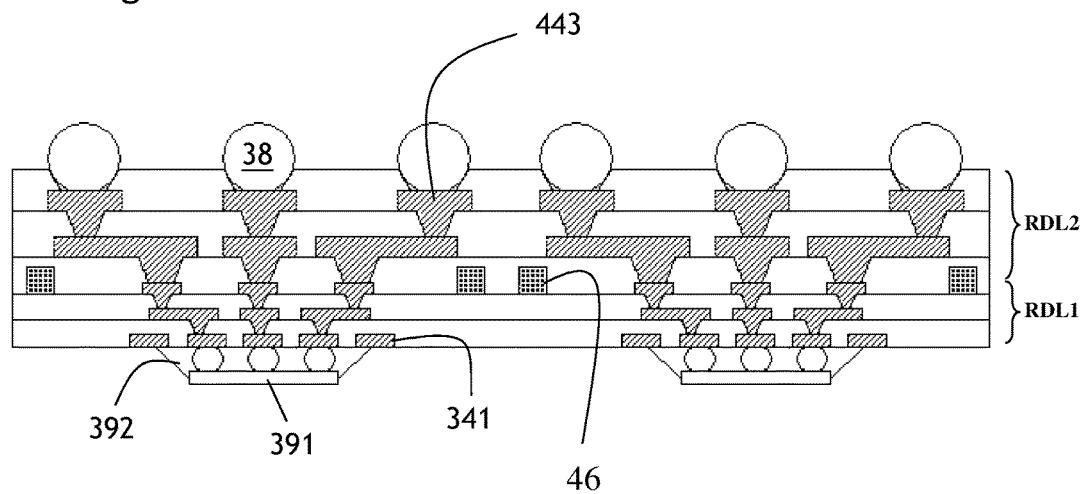

FIG. 4M shows: removing the temporary carrier; and removing the seed layer 32 from bottom of the bottom redistribution layer RDL1; and mounting at least a chip 391 on bottom of the bottom metal pad 341. Underfill 392 is configured in a space between the chip 391 and the metal pad 341.

Figure 4N:
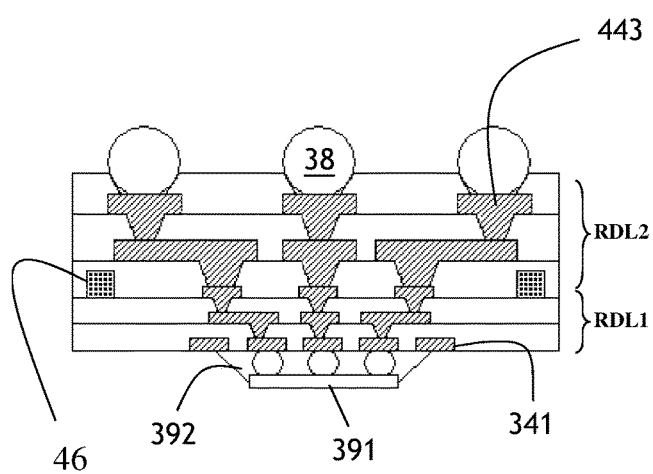

FIG. 4N shows: a single unit IC package singulated from the product of FIG. 4M.

FIG. 4N is a single unit of IC package with a roughed interface between top redistribution layer RDL2 and bottom redistribution layer RDL1. The roughness is caused by the plurality of metal bump 46.

While several embodiments have been described by way of example, it will be apparent to those skilled in the art that various modifications may be configured without departs from the spirit of the present invention. Such modifications are all within the scope of the present invention, as defined by the appended claims.

What is claimed is:

1. A redistribution film for IC package, the redistribution film comprising:
   a bottom redistribution layer configured according to IC design rule, the bottom redistribution layer having a plurality of bottom metal pads and a plurality of first top metal pads, wherein a layout density of the plurality of bottom metal pads is higher than a layout density of the plurality of first top metal pads;
   a top redistribution layer configured according to PCB design rule, the top redistribution layer configured on top of the bottom redistribution layer and having a plurality of second top metal pads, wherein the layout density of the plurality of first top metal pads is higher than a layout density of the plurality of second top metal pads;
   a dielectric layer over the top surface of the bottom redistribution layer,
   wherein
   the plurality of first top metal pads of the bottom redistribution layer, and bottom conductive features of the top redistribution layer, are embedded in the dielectric layer, the bottom conductive features of the top redistribution layer are in direct electrical and physical contact with the corresponding first top metal pads of the bottom redistribution layer,
   the bottom redistribution layer includes
       a plurality of first conductive layers, wherein a topmost first conductive layer among the plurality of first conductive layers includes the plurality of first top metal pads, and
       a plurality of first conductive vias coupling the plurality of first conductive layers to each other and to the plurality of bottom metal pads,
   the top redistribution layer includes
       a plurality of second conductive layers, wherein a topmost second conductive layer among the plurality of second conductive layers includes the plurality of second top metal pads, and
       a plurality of second conductive vias coupling the plurality of second conductive layers to each other and to the plurality of first top metal pads, and
   in a thickness direction in which the top redistribution layer is stacked on top of the bottom redistribution layer, the dielectric layer is (a) below the plurality of second conductive layers of the top redistribution layer and (b) above the plurality of first conductive vias of the bottom redistribution layer.

2. The redistribution film for IC package as claimed in claim 1, wherein
   the bottom redistribution layer has the plurality of first conductive layers and a plurality of first dielectric layers, each first conductive layer is embedded in a corresponding first dielectric layer; and
   the top redistribution layer has the plurality of second conductive layers and a plurality of second dielectric layers, each second conductive layer is embedded in a corresponding second dielectric layer.

3. The redistribution film for IC package as claimed in claim 2, wherein each first conductive layer of the plurality of first conductive layers is thinner, in thickness direction, than each second conductive layer of the plurality of second conductive layers.

4. The redistribution film for IC package as claimed in claim 3, wherein
each first conductive layer has a plurality of first circuits in width direction, each second conductive layer has a plurality of second circuits in width direction; and
each first circuit has a width narrower, in width direction, than each second circuit.

5. The redistribution film for IC package as claimed in claim 2, wherein
each first dielectric layer of the plurality of first dielectric layers is thinner, in thickness direction, than each second dielectric layer of the plurality of second dielectric layers.

6. The redistribution film for IC package as claimed in claim 5, further comprising:
a plurality of solder ball, each configured on a top surface of a corresponding second top metal pad.

7. The redistribution film for IC package as claimed in claim 6, further comprising:
a chip configured on a bottom surface of the plurality of first bottom metal pads.

8. A redistribution film for IC package, the redistribution film comprising:
a bottom redistribution layer configured according to IC design rule, the bottom redistribution layer having a plurality of bottom metal pads and a plurality of first top metal pads, wherein a layout density of the plurality of bottom metal pads is higher than a layout density of the plurality of first top metal pads, and the bottom redistribution layer has the plurality of first conductive layers and a plurality of first dielectric layers, each first conductive layer is embedded in a corresponding first dielectric layer;
a top redistribution layer configured according to PCB design rule, the top redistribution layer configured on top of the bottom redistribution layer and having a plurality of second top metal pads, wherein the layout density of the plurality of first top metal pads is higher than a layout density of the plurality of second top metal pads, the top redistribution layer has the plurality of second conductive layers and a plurality of second dielectric layers, each second conductive layer is embedded in a corresponding second dielectric layer, and each first conductive layer of the plurality of first conductive layers is thinner, in thickness direction, than each second conductive layer of the plurality of second conductive layers.;
a dielectric layer over the top surface of the bottom redistribution layer, wherein the plurality of first top metal pads of the bottom redistribution layer, and bottom conductive features of the top redistribution layer, are embedded in the dielectric layer, the bottom conductive features of the top redistribution layer are in direct electrical and physical contact with the corresponding first top metal pads of the bottom redistribution layer,
the bottom redistribution layer comprises:
a plurality of first conductive layers, wherein a topmost first conductive layer among the plurality of first conductive layers includes the plurality of first top metal pads, and
a plurality of first conductive vias coupling the plurality of first conductive layers to each other and to the plurality of bottom metal pads,
the top redistribution layer comprises:
a plurality of second conductive layers, wherein a topmost second conductive layer among the plurality of second conductive layers includes the plurality of second top metal pads, and
a plurality of second conductive vias coupling the plurality of second conductive layers to each other and to the plurality of first top metal pads, and
in a thickness direction in which the top redistribution layer is stacked on top of the bottom redistribution layer, the dielectric layer is (a) below the plurality of second conductive layers of the top redistribution layer and (b) above the plurality of first conductive vias of the bottom redistribution layer.

9. A redistribution film for IC package, the redistribution film comprising:
a bottom redistribution layer configured according to IC design rule, the bottom redistribution layer having a plurality of bottom metal pads and a plurality of first top metal pads, wherein a layout density of the plurality of bottom metal pads is higher than a layout density of the plurality of first top metal pads, and the bottom redistribution layer has the plurality of first conductive layers and a plurality of first dielectric layers, each first conductive layer is embedded in a corresponding first dielectric layer;
a top redistribution layer configured according to PCB design rule, the top redistribution layer configured on top of the bottom redistribution layer and having a plurality of second top metal pads, wherein the layout density of the plurality of first top metal pads is higher than a layout density of the plurality of second top metal pads, the top redistribution layer has the plurality of second conductive layers and a plurality of second dielectric layers, each second conductive layer is embedded in a corresponding second dielectric layer, and each first dielectric layer of the plurality of first dielectric layers is thinner, in thickness direction, than each second dielectric layer of the plurality of second dielectric layers;
a dielectric layer over the top surface of the bottom redistribution layer,
wherein the plurality of first top metal pads of the bottom redistribution layer, and bottom conductive features of the top redistribution layer, are embedded in the dielectric layer, the bottom conductive features of the top redistribution layer are in direct electrical and physical contact with the corresponding first top metal pads of the bottom redistribution layer,
the bottom redistribution layer comprises:
a plurality of first conductive layers, wherein a topmost first conductive layer among the plurality of first conductive layers includes the plurality of first top metal pads, and
a plurality of first conductive vias coupling the plurality of first conductive layers to each other and to the plurality of bottom metal pads,
the top redistribution layer comprises:
a plurality of second conductive layers, wherein a topmost second conductive layer among the plurality of second conductive layers includes the plurality of second top metal pads, and a plurality of second conductive vias coupling the plurality of second conductive layers to each other and to the plurality of first top metal pads, and in a thickness direction in which the top redistribution layer is stacked on top of the bottom redistribution layer, the dielectric layer is (a) below the plurality of second conductive layers of the top redistribution layer and (b) above the plurality of first conductive vias of the bottom redistribution layer.

* * * * *